(12) United States Patent
Yamaguchi (10) Patent No.: US 6,960,502 B2
(45) Date of Patent: Nov. 1, 2005

(54) SEMICONDUCTOR DEVICE FABRICATION METHOD

(75) Inventor: Akihisa Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/351,433

(22) Filed: Jan. 27, 2003

(65) Prior Publication Data

US 2003/0232491 A1    Dec. 18, 2003

(30) Foreign Application Priority Data

Jun. 18, 2002    (JP) ............................. 2002-177506

(51) Int. Cl.[7] ......................................... H01L 21/3105
(52) U.S. Cl. ...................... 438/216; 438/287; 438/763; 438/765; 438/792
(58) Field of Search ................................ 438/216, 287, 438/763, 765, 954, FOR 489, 792

(56) References Cited

U.S. PATENT DOCUMENTS

| | | | |
|---|---|---|---|
| 5,962,344 A | * | 10/1999 | Tu et al. ..................... 438/694 |
| 6,150,226 A | * | 11/2000 | Reinberg .................... 438/381 |
| 6,245,652 B1 | * | 6/2001 | Gardner et al. ............. 438/592 |
| 6,387,761 B1 | * | 5/2002 | Shih et al. .................. 438/287 |
| 6,403,420 B1 | * | 6/2002 | Yang et al. ................. 438/261 |
| 6,451,662 B1 | * | 9/2002 | Chudzik et al. ............ 438/386 |
| 6,504,173 B2 | * | 1/2003 | Hsu et al. ..................... 257/60 |
| 6,544,900 B2 | * | 4/2003 | Raaijmakers et al. ....... 438/769 |
| 2002/0124867 A1 | * | 9/2002 | Kim et al. .................... 134/1.2 |
| 2003/0157771 A1 | * | 8/2003 | Luoh et al. .................. 438/287 |

OTHER PUBLICATIONS

Wu et al., "Improvement of Gate Dielectric Realiabiltiy for p+ Poly MOS Devices Using Remote PECVD TOP Nitride Deposition on Thin Gate Oxides", Mar. 31-Apr. 2, 1998, IEEE International, 36th Annual International Reliability Physics Symposium, pp. 70-75.*

Wu, Yider, "The Performance and Reliability of PMOSFET's with Ultrathin Silicon Nitride/Oxide Stacked Gate Dielectrics with Nitrided Si—SiO2 . . . Rapid Thermal Annealing", IEEE Transactions oon Electron Devices, vol. 47, No. 7, Jul. 2000, pp. 1361-1369.*

2001 Symposium on VLSI Technology, session T7A-4, Y. Yasuda et al., "Radical Nitridation in Multi-oxide Process for 100nm Generation CMOS Technology", Kyoto, Japan, Jun. 12-14, 2001, pp. 83-84/Discussed in the specification.

* cited by examiner

Primary Examiner—George Fourson
(74) Attorney, Agent, or Firm—Westerman, Hattori, Daniels & Adrian, LLP (57) ABSTRACT

A reduction of a leakage current as well as a decrease in the thickness of an insulating film is realized in a semiconductor device. To this end, a silicon oxide film and a silicon nitride film are formed on a substrate, which is then heated to a temperature within a range of 20° C.–600° C. so that a plasma nitridation process can be performed on the silicon nitride film. Further, a thermal process is performed in a non-oxide gas atmosphere. By performing these processes, the gate leakage current can be significantly reduced in the formed gate insulator, and the silicon oxide-equivalent thickness of the insulating film can be significantly decreased as well.

22 Claims, 9 Drawing Sheets

PRIOR ART

SEMICONDUCTOR DEVICE FABRICATION METHOD

BACKGROUND OF THE INVENTION

1. Field of the Invention

The present invention relates generally to a semiconductor device and particularly to a super high-speed semiconductor device having a gate insulator made of a silicon nitride film and a method of fabricating the same.

2. Description of the Related Art

In a semiconductor integrated circuit device such as the CMOS-LSI where super high-speed operation is greatly demanded, the field effect transistor (MOSFET) making up the semiconductor integrated circuit device must have a very short gate length. Thus, a great effort is being made in miniaturizing the MOSFET.

In the miniaturized MOSFET, as the gate length of the MOSFET is decreased, the film thickness of the gate insulator is also restricted due to the scaling law. For example, in a semiconductor device with a gate length below 0.1 $\mu$m, the film thickness of the gate insulator must be reduced to a silicon oxide film-equivalent thickness of no more than 2 nm.

Conventionally, a silicon oxide film, which generally has good leakage current characteristics and a low interface state density, is used as the gate insulator. However, in the conventional gate insulator made of a silicon oxide film, the direct tunneling current increases with the reduction of the physical film thickness of the gate insulator. Thus, when the film thickness of the gate insulator is reduced even further than the above value, the gate leakage current due to the tunneling current will be a big problem. For example, when the gate leakage current increases, a substantial leakage current may be generated even when the gate is turned off and the circuit of the semiconductor device may not operate properly, or substantial problems owing to physical laws such as the increase in electricity consumption may arise.

In the conventional art, the silicon oxide film is replaced with a high dielectric constant film, which has a small electric equivalent thickness in spite of a large physical thickness, as the gate insulator.

The gate capacity C can generally be expressed as $C = \epsilon_O \epsilon_K A / d_K$, where $\epsilon_O$ is the permittivity (i.e. the dielectric constant) in a vacuum; $\epsilon_K$ is the relative dielectric constant of the insulator; A denotes the area of the insulator; and $d_K$ denotes the film thickness of the insulator. When a high dielectric constant film, which has a higher relative dielectric constant $\epsilon_n$ than that of the silicon oxide film, is used as the gate insulator, the film thickness $d_P$ of the above high dielectric constant film that realizes the same gate capacity as that of the silicon oxide film can be expressed as $d_P = \epsilon_P / \epsilon_{ox} \times d_{ox}$, where $\epsilon_{ox}$ and $d_{ox}$ represent the relative dielectric constant and the film thickness of the silicon oxide film, respectively. Thus, a gate insulator implementing a high dielectric constant film having electric characteristics that are equivalent to those of a silicon oxide film with a thickness of $d_{ox}$ can be realized with a physical film thickness of $d_P$. The relationship between the film thickness of the silicon oxide film $d_{ox}$ and the physical thickness of the high dielectric constant film $d_P$ having the equivalent electric characteristics can be expressed as $d_{ox} = \epsilon_{OX} / \epsilon_P \times d_P$, where the ratio of the relative dielectric constant $\epsilon_{OX}$ of the silicon oxide film to the relative dielectric constant $\epsilon_P$ of the insulator is used as the coefficient. The film thickness $d_{OX}$ of the silicon oxide film calculated from the actual film thickness $d_P$ of the insulator using the above equation is called the silicon oxide film-equivalent thickness.

For example, a silicon nitride ($Si_3N_4$) film, which has twice the relative dielectric constant as that of the silicon oxide film, can be used as the gate insulator of the MOS transistor making up the super high-speed CMOS (Complementary MOS) element that has a gate length below 0.1 $\mu$m. The silicon nitride film has better compatibility with the CMOS fabrication process compared to metal oxide insulators such as $Al_2O_3$, $ZrO_2$, or $Ta_2O_5$ insulators, and can be easily implemented to the gate insulator. Thus, for example, even when the physical film thickness of the gate insulator is more than 2 nm, a silicon oxide film-equivalent thickness of 2 nm or less can be realized, and this enables a faster operation of the semiconductor device as well as the prevention of the gate leakage current due to the tunnel effect.

In a case where the silicon nitride film is directly mounted onto the silicon substrate, nitrogen is condensed on the interface between the silicon substrate and the silicon nitride film, and the carriers transported at a fast rate in the channel region may possibly be scattered. In other words, in the above structure, the mobility of the carriers is decreased due to the nitrogen at the interface, and the threshold characteristics of the semiconductor device are also destabilized due to the carriers being trapped by the dangling bonds in the silicon nitride film.

For example, the formation of the silicon nitride film is usually accomplished using the CVD (chemical vapor deposition) technique; however, the silicon nitride film formed using this technique has many defects and dangling bonds as well as hydrogen atoms that terminate as in the above. Thus, it is difficult to obtain the appropriate film quality of the gate insulator formed in the channel region where the carriers are transported at a fast rate. Also, in a case where thermal processing is performed in a nitrogen atmosphere in order to resolve the above defects, the nitrogen atoms are diffused onto the interface of the silicon substrate thereby causing the dispersion of the carriers and the loss of its mobility. Further, when the dangling bonds trap the carriers, the threshold characteristics of the semiconductor device change.

In response to the above problems, thermal processing of the CVD silicon nitride film in an oxide gas atmosphere can be contemplated so as to avoid the problems arising from the thermal processing in a nitrogen atmosphere; however, in such a case, the oxygen atoms are diffused onto the interface of the silicon substrate thereby lowering the dielectric constant of the silicon nitride film and causing an oxide film to be formed on the interface of the silicon substrate and the gate insulator. The formation of the oxide film cancels out the effects of using a silicon nitride film with a high dielectric constant; thus, such an effect should be avoided by all means.

Alternatively, there is a technique of performing a plasma nitridation process on the surface of the silicon oxide film to form a silicon nitride film; more precisely, a technique of forming a silicon nitric-oxide film has been proposed in the conventional art. For example, this technique is disclosed in: VLSI Symposium 2001, session T7A-4. According to this technique, nitrogen atoms and oxygen atoms are intermingled within the silicon nitric-oxide film, and the segregation of the nitrogen atoms on the interface of the silicon substrate and the silicon nitric-oxide film can be prevented.

Figure 1A:
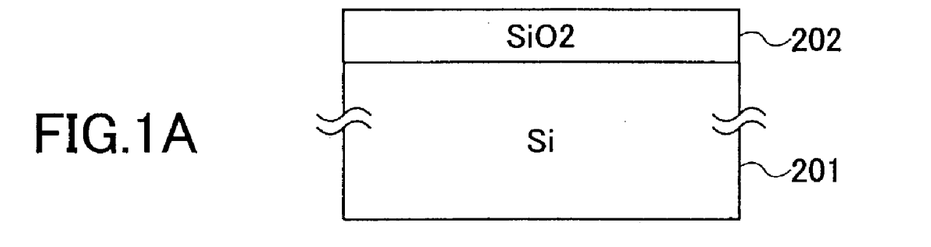
FIGS. 1A–1C illustrate the property modification process of the silicon oxide film using the plasma nitridation process according to the prior art.
Figure 1B:
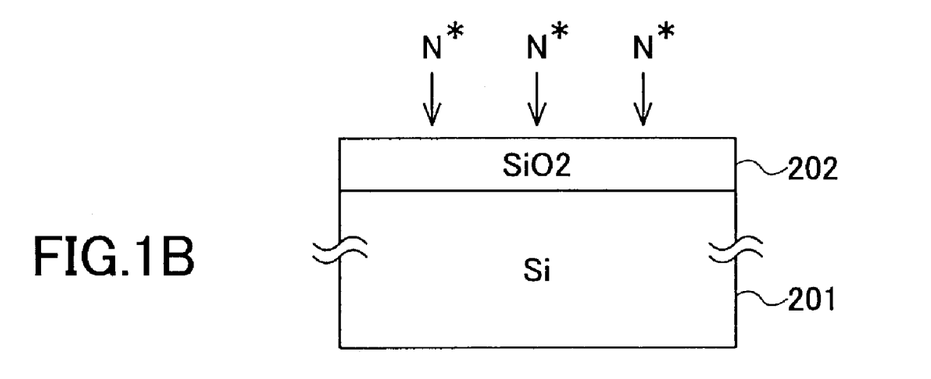
Figure 1C:
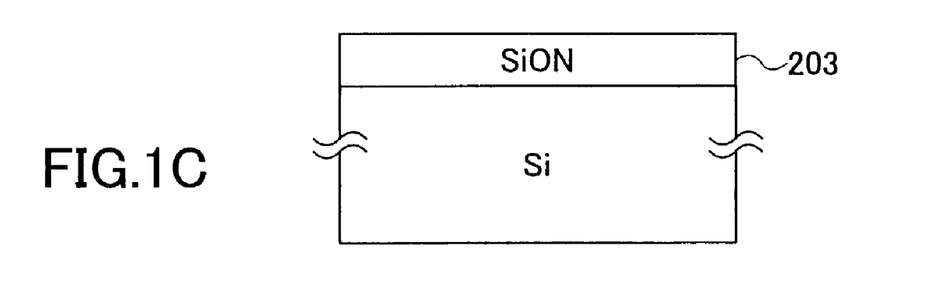

FIGS. 1A through 1C illustrate the steps in forming the high dielectric constant gate insulator through plasma nitridation of the above silicon oxide film.

In FIG. 1A, a thermal oxide film 202 with a film thickness of 2 nm, for example, is formed on a silicon substrate 201;

in FIG. 1B, the plasma nitridation process is performed on the above thermal oxide film 202 so that it is nitrided by nitrogen radicals N*; and in FIG. 1C, the resulting silicon nitric-oxide film is shown.

As previously mentioned, in the silicon nitric-oxide film formed in the above manner, nitrogen atoms and oxygen atoms are intermingled, and the segregation of the nitrogen atoms on the interface of the silicon substrate can be prevented. Thus, by using the above silicon nitric-oxide film as the gate insulator, the carriers being transported at a fast rate in the channel region can be prevented from being scattered by the nitrogen atoms on the interface of the gate insulator and the silicon substrate.

However, in the above conventional art, the film 203 functioning as the gate insulator is made of a silicon nitric-oxide film (SiON film), which has a smaller dielectric constant compared to the silicon nitride film; therefore a dramatic reduction of the silicon oxide-equivalent thickness cannot be expected from such a structure. In other words, although the relative dielectric constant of the silicon nitric-oxide film is affected by the nitrogen concentration in the film, when the nitridation process is performed on the $SiO_2$ film, the quantity of the nitrogen atoms that may be incorporated into the film is limited since the oxygen atoms already reside in the film.

SUMMARY OF THE INVENTION

The present invention has been developed in response to the above described problems of the conventional art and its object is to provide a fabrication method of a semiconductor device that enables a reduction of the leakage current of the gate insulator and a further reduction in the silicon oxide-equivalent thickness of the gate insulator.

The present invention, according to one aspect, provides a method of fabricating a semiconductor device comprising the steps of forming an insulating film containing silicon and oxygen on a silicon substrate; forming a silicon nitride film on top of said insulating film; and modifying the properties of said silicon nitride film by performing a plasma nitridation process.

By forming an insulating film containing silicon and oxygen on a silicon substrate, the segregation of the nitrogen atoms on the interface of the substrate and the insulating film can be prevented and by forming a silicon nitride film with a high relative dielectric constant on the insulating film, the silicon oxide-equivalent thickness of the entire film including the insulating film and the silicon nitride film can be greatly reduced. Particularly, by making the film thickness of the above insulating film containing silicon and oxygen smaller than the film thickness of the silicon nitride film, an even smaller silicon oxide-equivalent thickness can be realized.

Generally, a significant amount of dangling bonds and lattice defects exist within a silicon nitride film. Thus, in the present invention, a plasma nitridation process is performed on the silicon nitride film formed in the above process so that active nitrogen radicals enter the silicon nitride film and terminate the above dangling bonds and the lattice defects. As a result, the silicon nitride film will have a composition that is very close to the ideal stoichiometric composition of $Si_3N_4$, and the silicon oxide-equivalent thickness can be further reduced. Thus, by using such a film as the gate insulator, the gate leakage current due to the tunnel effect can be controlled and the silicon oxide-equivalent thickness of the gate insulator can be reduced as the gate length is reduced. Also, the gate insulator having the above-described composition has very few traps, thereby preventing the threshold characteristics of the semiconductor device from changing upon the entering of carriers such as over-accelerated electrons.

Further, since the semiconductor device fabrication method of the present invention can realize a small silicon oxide-equivalent thickness or an effective film thickness with a relatively large physical film thickness, it can be implemented in the formation of a capacitor such as is used in DRAM to achieve a low leakage current from the tunnel effect as well as a large capacitance.

Figure 2A:
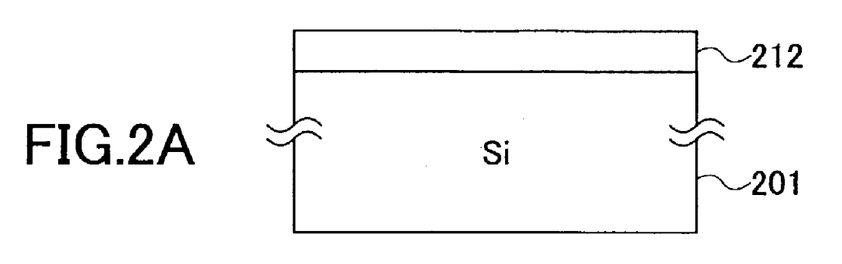
FIGS. 2A–2C illustrate the overall mechanism of the present invention.
Figure 2B:
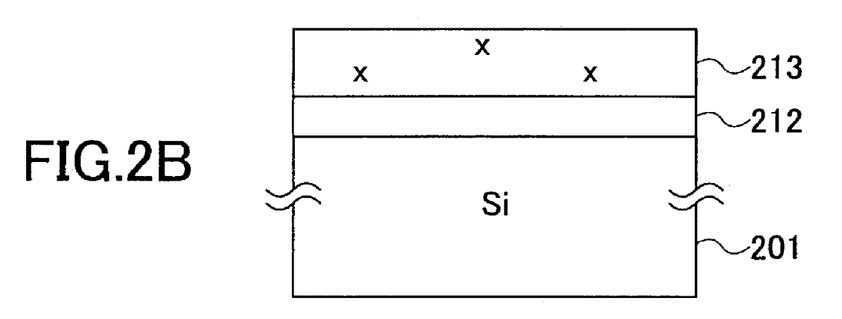
Figure 2C:
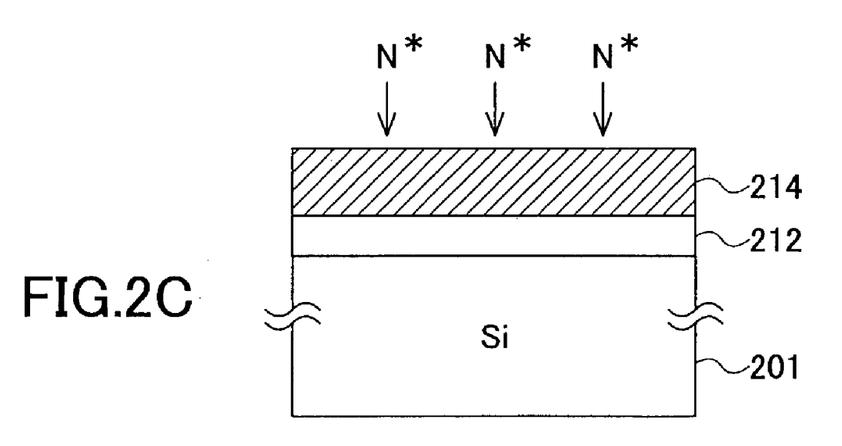

FIG. 2 illustrates the mechanism of the present invention; however, the parts shown in FIG. 2 that correspond to the parts described in the previous section are given the same numerical notations and their descriptions are omitted.

In FIG. 2A a very thin insulating film 212 such as a silicon oxide film or a silicon nitric-oxide film is formed on a silicon substrate 201, and in the step of FIG. 2B a silicon nitride film 213 is formed on top of the structure of FIG. 2A. The insulating film 212 contains silicon and oxygen, and must be a film that does not create an interface state at the interface of the silicon substrate or a segregation of elements. The silicon nitride film 213 can be mounted using the CVD technique and the like.

The silicon nitride film 213 formed onto the substrate in the above process usually has a significant amount of dangling bonds and defects within its film as indicated by the X marks in the drawing. As a result, the silicon nitride film 213 is likely to have a composition that is far from the ideal stoichiometric composition of $Si_3N_4$. Thus, in the present invention a plasma nitridation process is performed on the silicon nitride film 213, and nitrogen radicals indicated by notation N* in the drawing are incorporated into the silicon nitride film 213 as shown in FIG. 2C. The incorporated nitrogen radicals can then terminate the defects and dangling bonds within the silicon nitride film 213. As a result the silicon nitride film 213 has a composition that is close to the ideal stoichiometric composition of $Si_3N_4$, and the silicon nitride film 213 is modified into a high quality silicon nitride film 214 with a reduced concentration of the dangling bonds and defects.

In the present invention, the nitrogen radicals are generated by the plasma nitridation process of FIG. 2C. The nitrogen radicals generated in the above manner can effectively enter even a densely packed silicon nitride film 213, and can bring about the desired property modification. In such a case, a portion of the nitrogen radicals reach down to the insulating film 212 and a nitridation process is performed thereon. As a result, the relative dielectric constant of the entire film including the insulating film 212 and the silicon nitride film 214 can be augmented. The nitrogen radicals incorporated into the film should not cause the segregation of the nitrogen atoms at the interface between the insulating film 212 and the substrate 201. Thus, even when the above film is implemented in the gate electrode of a super high speed semiconductor device with a short channel length, the scattering of the carriers, which is caused by the segregation of the nitrogen atoms, can be avoided.

DESCRIPTION OF THE PREFERRED EMBODIMENTS

In the following, a description of the preferred embodiments of the present invention is given with reference to the accompanying drawings.

According to a first embodiment of the present invention, a silicon oxide film is formed on the substrate through thermal oxidation. This is followed by the formation of a silicon nitride film using the CVD technique, which is then subjected to the plasma nitridation process and then the thermal process in a non-oxide gas atmosphere.

FIGS. 3A through 3D and FIGS. 4E and 4F illustrate the fabrication steps of a CMOS device using a semiconductor substrate with a certain conductivity such as a p-type silicon substrate.

Figure 3A:
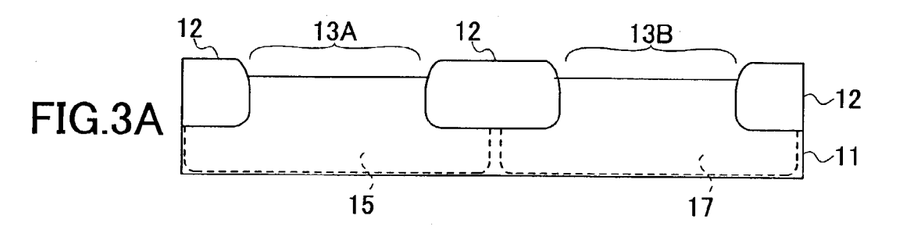
FIGS. 3A–3D illustrate the fabrication steps (first part) of the CMOS device according to the first embodiment of the present invention.

In FIG. 3A, isolation regions 12 are formed on the p-type silicon substrate 11 using the LOCOS (local oxidation of silicon) technique or the STI (shallow trench isolation) technique, and element regions 13A and 13B are formed by the above isolation regions. Further, in a resist process (not shown), by masking one of the element regions, for example, element region 13B, and performing an ion implantation on the element region 13B, the p-type dopant ions such as $B^+$ are implanted to element region 13A thereby forming a p-type well 15. In a similar fashion, the n-type dopant ions such as $As^+$ or $P^+$ are implanted to the other element region 13B thereby forming an n-type well 17.

Figure 3B:
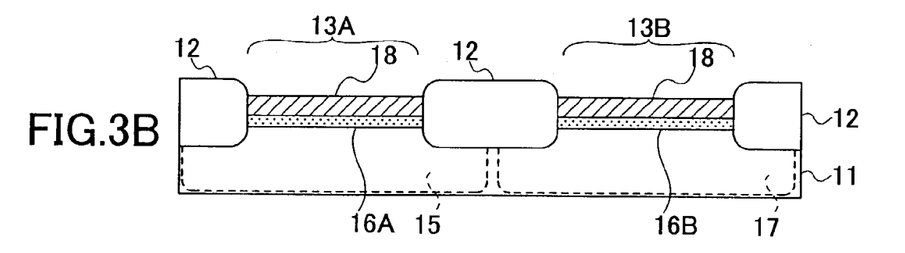

In the step of FIG. 3B, an nMOS channel dope region 16A is formed by implanting p-type dopant ions such as $B^+$ or $In^+$ into element region 13A, the region in which the p-type well 15 is formed through ion implantation while the other element region 13B is masked through the resist process (not shown). Then, in a similar fashion, n-type dopant ions such as $As^+$ or $P^+$ are implanted to the region element 13B having the n-type well 17 so as to form pMOS channel dope region 16B.

The step of FIG. 3B further comprises the steps of removing the natural oxide film on the surface of the silicon substrate 11 through HF processing and the like, and performing a thermal oxidation process to form a silicon oxide film 18 with a thickness of no more than 1.5 nm, preferably, no more than 0.8 nm. The above thermal oxidation processing step is, for example, performed at a temperature of 600° C.–1100° C., and for a period of 1–20 minutes. As a result, a silicon oxide film 18 with a thickness of 0.5 nm–1.5 nm is formed on the surface of the channel regions 16A and 16B. In this first embodiment, the oxygen gas pressure is set to 10 Pa, the nitrogen gas pressure to 10 Pa, and an annealing process is performed for a period of 8 minutes at a temperature of 850° C. to form a silicon oxide film 18 with a thickness of 1.0 nm.

Figure 3C:
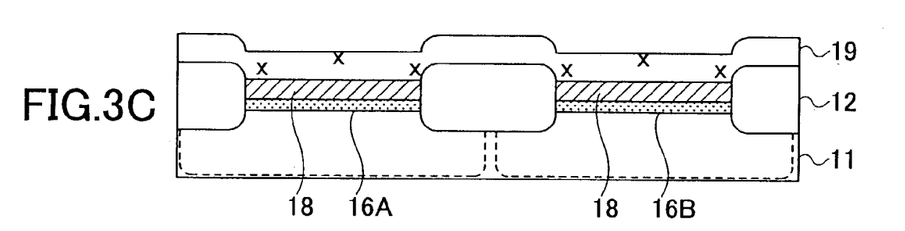

In the process of FIG. 3C, a silicon nitride film 19 is supplied on top of the silicon oxide film 18 and the isolation regions 12 using, for example, the low-pressure CVD technique, wherein the pressure within the chamber is set to 1 Pa–100 Pa; the substrate temperature to 600° C.–800° C.; the flow of the dichlorosilane gas, as the silicon material, to 1 sccm–100 sccm; and the flow of the ammonia gas, as the nitrogen material, to 1 sccm–1000 sccm. By supplying the above material gases for a period of 0.5–30 minutes, a silicon nitride film 19 having a thickness of 0.5 nm–1.5 nm is formed on the structure of FIG. 3B as shown in FIG. 3C. In this embodiment, a silicon nitride film 19 with a thickness of 1.3 nm is formed by setting the pressure in the chamber to 20 Pa; the flow of the dichlorosilane gas to 30 sccm; the flow of the ammonia gas to 150 sccm; the temperature of the substrate to 600° C.; and supplying the mixed gas for a period of 3 minutes.

The silicon nitride film 19 formed according to the CVD technique in the manner descried above generally has a significant amount of defects, namely, dangling bonds (represented by X marks in FIG. 3C).

Figure 3D:
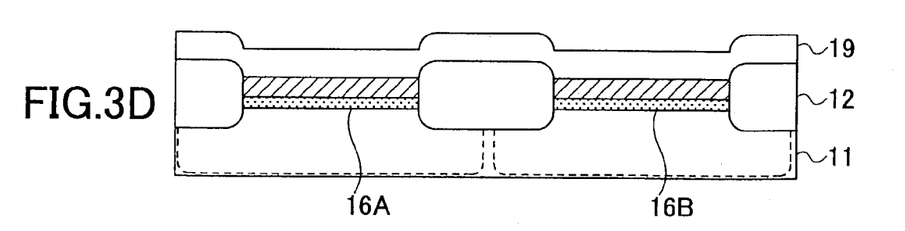

According to this embodiment, a plasma nitridation process is performed on the silicon nitride film 19 of FIG. 3C in the step of FIG. 3D using a remote plasma nitridation apparatus.

Figure 5:
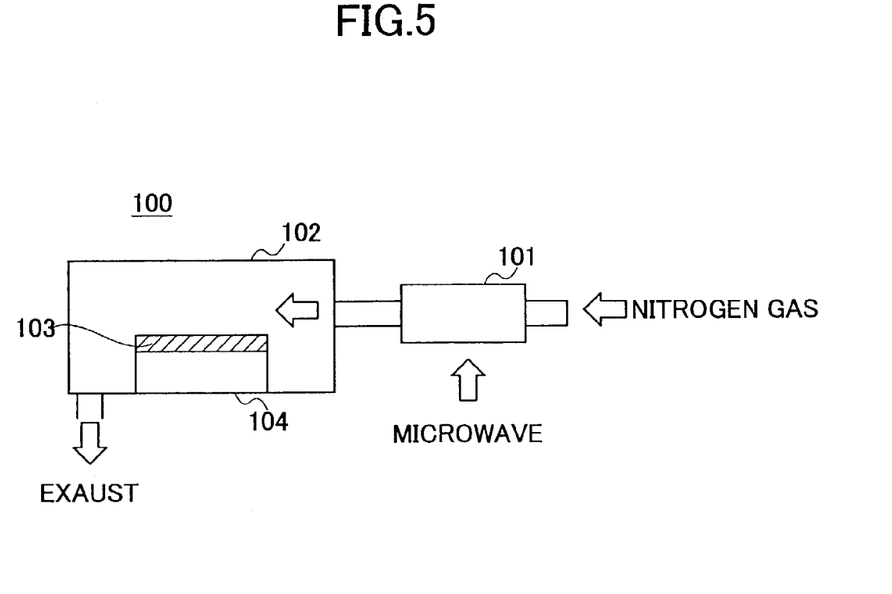
FIG. 5 illustrates the essential composition of the remote plasma nitridation apparatus according to the first embodiment of the present invention.

FIG. 5 shows the essential structure of the above remote plasma nitridation apparatus.

The remote plasma nitridation apparatus 100 in FIG. 5 comprises a processing chamber 102 for processing the substrate 103, and a remote plasma generating device 101, placed outside the processing chamber 102. Nitrogen gas is supplied to the remote plasma generating device 101, and nitrogen radicals and nitrogen ions are formed by exciting the above nitrogen gas using microwaves. The nitrogen radicals and nitrogen ions are transferred to the processing chamber 102 where they nitride the surface of the substrate 103 implemented on the stage 104.

More specifically, the nitrogen radicals and nitrogen ions can be generated, by supplying $N_2$ gas and He gas at 1000 sccm and 2000 sccm, respectively, for example, to the plasma generated with a microwave power of 0.5 kW–3 kW. The nitrogen radicals and nitrogen ions produced accordingly land on the silicon nitride film 19 of the substrate, which is heated to a temperature within the range of 20° C.–600° C., thereby changing the properties of the film. If the substrate temperature is raised above 600° C. in the above process, the above nitrogen may be diffused from the silicon nitride film 19 and may reach the interface of the silicon oxide film 18 and the silicon substrate 11, thereby decreasing the mobility of the carriers of the MOS transistor. In this embodiment, the plasma is generated with an output of 3 kW and the nitrogen radicals and nitrogen ions are flowed for 60 seconds at a substrate temperature of 550° C.

In the above plasma nitridation process, the nitrogen radicals and nitrogen ions entering the silicon nitride film 19 terminate the dangling bonds. In this way, the leakage current of the gate insulator made of the silicon oxide film 18 and the silicon nitride film 19 can be reduced thereby enabling a further reduction of the silicon oxide-equivalent thickness of the gate insulator.

Further, after the above nitridation process, thermal processing is performed on the substrate in a non-oxide gas atmosphere comprising passive gas such as $N_2$, He, Ar, Kr, or Xe, for example, as shown in the process step of FIG. 3D.

Specifically, the above thermal process involves heating the substrate to a temperature within the range of 600° C.–1100° C. in a non-oxide gas atmosphere and performing an annealing process for a period of 5–180 seconds. Preferably, the above thermal process is performed at a high temperature in a short period of time within the above ranges set forth. By performing the thermal process under these conditions, the diffusion of the nitrogen atoms in the silicon nitride film 19 towards the substrate interface can be prevented, and the disarray of the crystal lattice in the silicon nitride film 19 can be eliminated. Further, the above thermal process is preferably performed using a RTP (rapid thermal process) device that implements a halogen lamp or a furnace RTP device so that the desired substrate temperature can be achieved in a short period of time. In this embodiment, the substrate is heated to 1050° C. in a $N_2$ gas atmosphere, and the annealing process is performed for 10 seconds.

As a result of the above thermal process, the damage caused by the plasma nitridation process on the silicon nitride film 19 such as a disarray in the crystal lattice can be eliminated, and the excessive nitrogen atoms remaining in the silicon nitride film 19 can be emitted outward. Thus, the further densification of the silicon nitride film 19 can be realized and the leakage current of the gate insulator can be reduced.

Figure 4E:
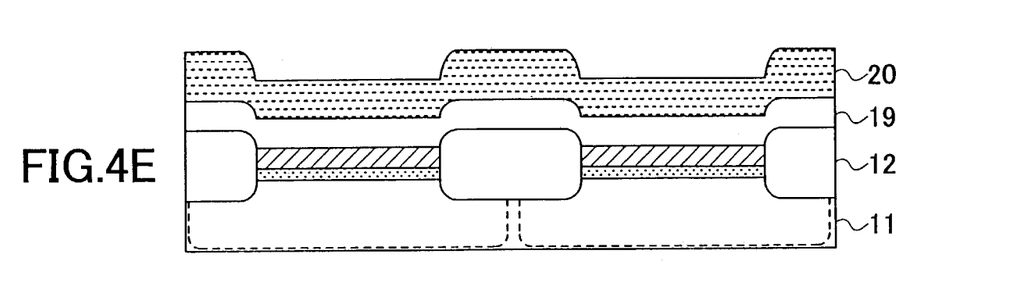
FIGS. 4E–4F illustrate the fabrication steps (second part) of the CMOS device according to the first embodiment of the present invention.

Next, in FIG. 4E the substrate is moved to a chamber of a different CVD device and a poly-silicon film 20 is formed on top of the silicon nitride film 19. For example, the pressure within the chamber of the CVD device can be set to 10 Pa–50 Pa, the temperature of the substrate to 600° C.–650° C., and flow of the mono-silane gas to 50 sccm–300 sccm, according to the low-pressure CVD technique, wherein the mono-silane gas is flowed for 5–60 minutes so as to form a poly-silicon film 20 with a thickness of 20 nm–200 nm. In this embodiment, the pressure within the chamber is set to 40 Pa, the substrate temperature to 620° C., and the flow of the mono-silane gas to 200 sccm, wherein the mono-silane gas is flowed for 20 minutes to form a poly-silicon film 20 with a thickness of 110 nm.

Figure 4F:
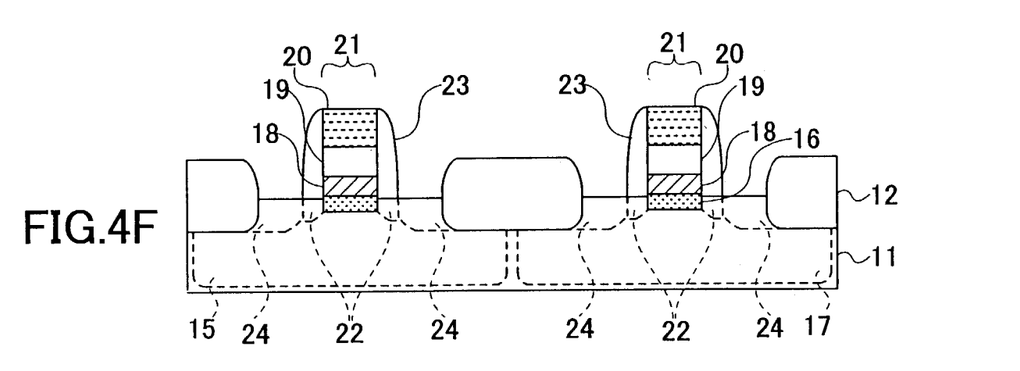

In FIG. 4F, a patterning process is performed on the poly-silicon film 20 according to a photo lithography technique, thereby forming a gate electrode structure 21 having the poly-silicon film 20 implemented on the silicon nitride film 19 and the silicon oxide film 18. Then according to an ion implantation technique, As ions are implanted to the n channel region 13A and B ions are implanted to the p channel region 13B with the above gate electrode structure 21 as the mask; and LLD (Lightly Doped Drain) regions 22 are formed on both sides of the gate electrode structure 21 placed in the silicon substrate 11.

Then the side wall insulators 23, made of $SiO_2$, for example, are formed on the two side walls of the gate electrode structure 21 using the CVD technique and the etch back technique.

Then the As ions are implanted to the n channel region 13A and B ions are implanted to the p channel region 13B in accordance with the ion implantation technique, thereby forming source/drain regions 24.

In this way, the gate insulator having the silicon oxide film 18 and silicon nitride film 19 layered in this order is formed, resulting in the CMOS device as shown in FIG. 4F.

As described above, in the silicon nitride film 19 formed on top of the silicon oxide film 18, the dangling bonds situated therein are terminated and stabilized by the nitrogen radicals and nitrogen ions using the plasma nitridation process. In such a semiconductor device, the leakage current of the gate insulator can be reduced and the gate insulator can be made thinner. Also, by performing the thermal process in a non-oxide gas atmosphere, the damage caused by the plasma nitridation process can be eliminated, the silicon nitride film 19 can be further densified, and the leakage current of the gate insulator can be further reduced.

A second embodiment of the present invention involves performing a plasma nitridation process on the silicon oxide film 18 as well as performing the processes described in the first embodiment.

Figure 6A:
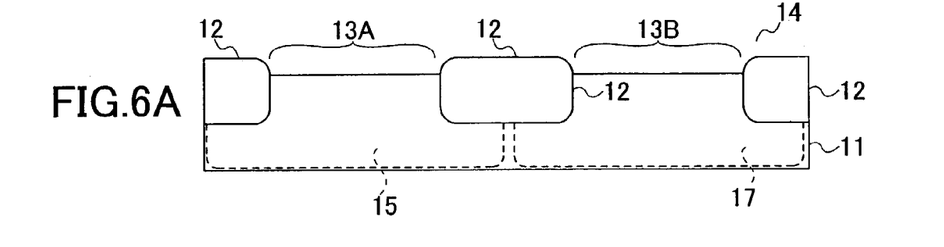
FIGS. 6A–6D illustrate the fabrication steps (first part) of the CMOS device according to the second embodiment of the present invention.
Figure 6B:
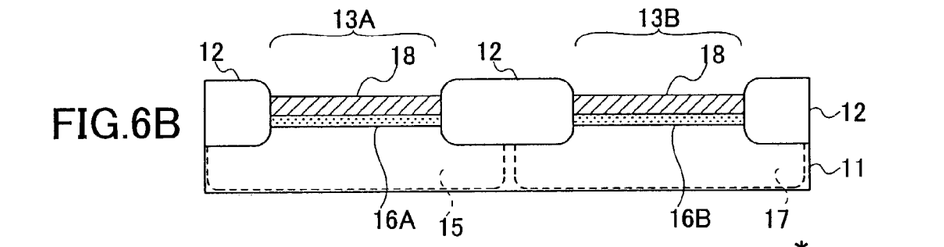
Figure 6C:
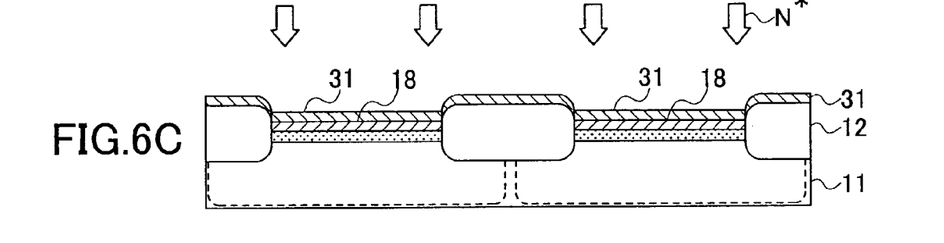
Figure 6D:
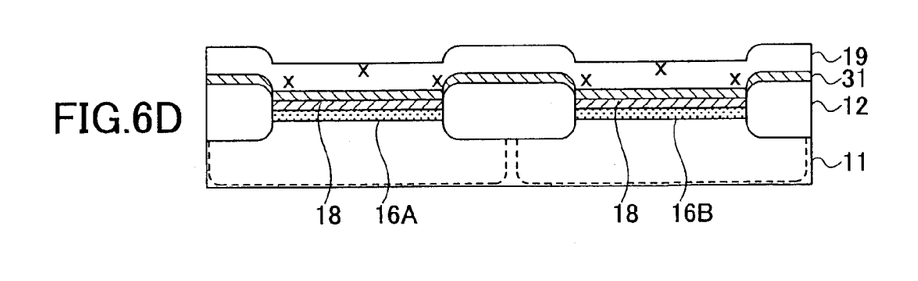
Figure 7E:
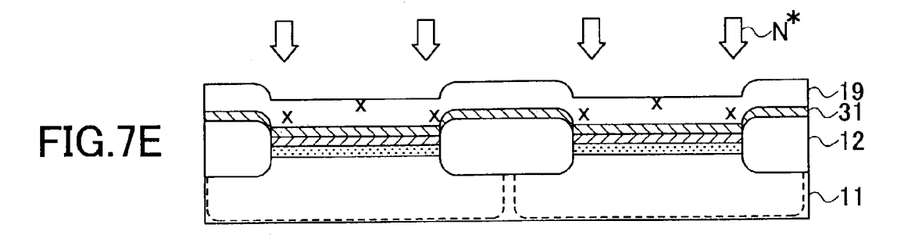
FIGS. 7E–7G illustrate the fabrication steps (second part) of the CMOS device according to the second embodiment of the present invention.
Figure 7F:
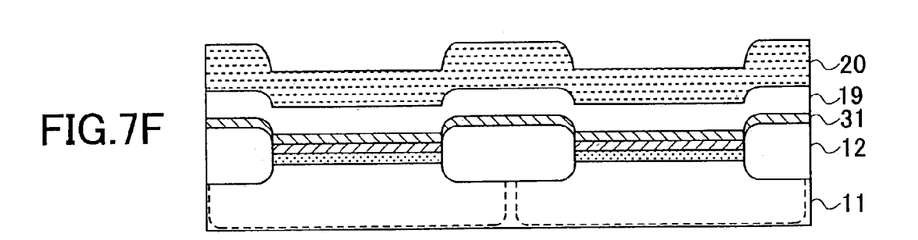
Figure 7G:
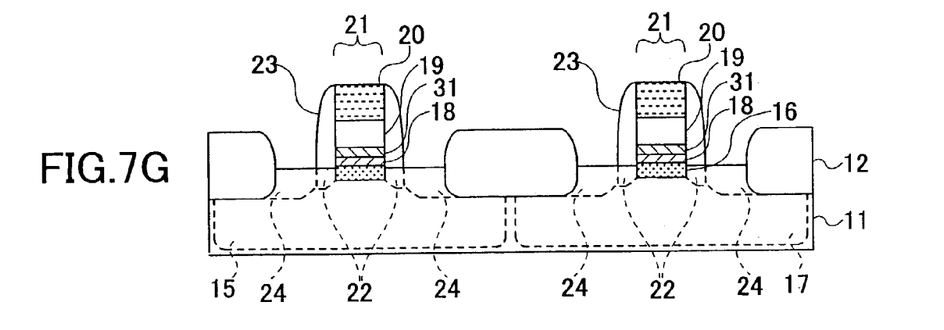

FIGS. 6 and 7 illustrate the fabrication steps of the CMOS device using a semiconductor substrate with a certain conductivity such as a p-type substrate. In these drawings, the same numerical notations are assigned to the parts that correspond to the parts described above, and their descriptions are omitted.

In the process of FIGS. 6A and 6B, isolation regions 12 are formed on an n-type silicon substrate 11 thereby forming element regions 13A and 13B; and a p well 15 is formed in one of the element regions 13A and an n well 17 is formed in the other element region 13B, as in the first embodiment. Then channel dope regions 16A and 16B are formed in the respective element regions 13A and 13B, and a silicon oxide film 18 is formed through thermal oxidation. In this embodiment, the annealing process is performed for 8 minutes at 850° C., and a silicon oxide substrate 18 with a thickness of 1.0 nm is formed.

Figure 8:
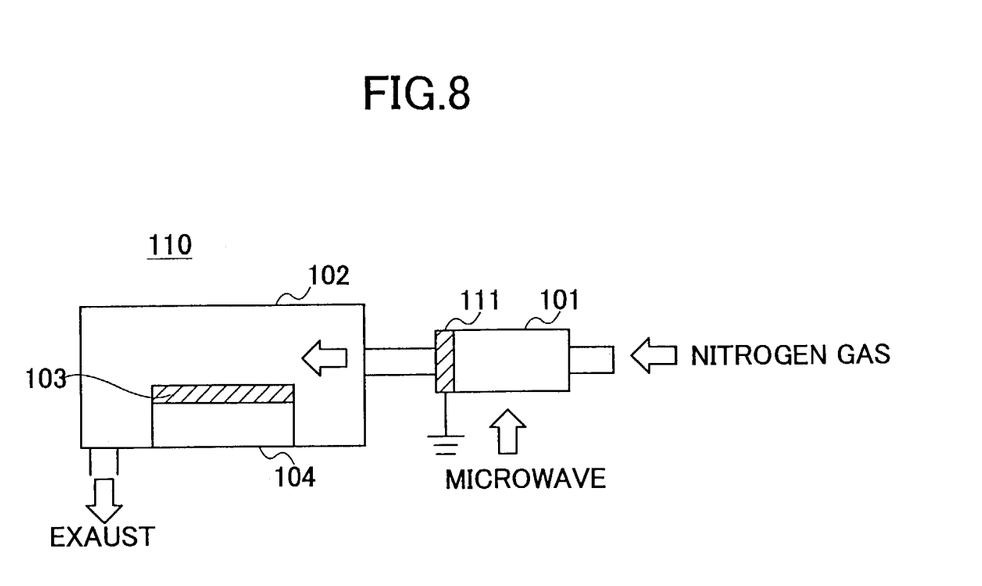
FIG. 8 illustrates the essential composition of the remote plasma nitridation apparatus according to the second embodiment of the present invention; and, FIG. 9 indicates the relationship between the gate leakage current and the silicon oxide-equivalent thickness.

In the process step of FIG. 6C, a plasma nitridation process is performed on the silicon oxide film 18 using a remote plasma nitridation apparatus shown in FIG. 8.

FIG. 8 shows the essential structure of the above remote plasma nitridation apparatus.

The remote plasma nitridation apparatus 110 in FIG. 8 has the same structure as that of the remote plasma nitridation apparatus 100 shown in FIG. 5 but is additionally provided with an ion filter 111 implemented to the plasma generating device 101. The ion filter 111 has a mesh structure made of conductive material such as metal and is grounded. The ion filter 111 is implemented at the flow path of the nitrogen radicals and nitrogen ions generated at the plasma generating device 101, and it traps only the nitrogen ions, which are the charged particles. Thus, only the nitrogen radicals are flowed into the chamber.

For example, $N_2$ gas and He gas with a flow of 1000 sccm and 2000 sccm, respectively, are supplied to the plasma generated at a microwave power of 0.5 kW–3 kW so as to generate the nitrogen radicals and nitrogen ions. The generated nitrogen radicals and nitrogen ions are then passed through the ion filter 111 wherein the nitrogen ions are removed. Thus in this embodiment, only the nitrogen radicals N* are supplied to the substrate surface in the processing chamber 102.

Then the substrate is heated to a temperature within a range of 20° C.–600° C., wherein the nitrogen radicals N* react to the silicon oxide film 18. In this embodiment, the plasma is generated with an output of 3 kW, and only the nitrogen radicals are flowed in for 60 seconds at a substrate temperature of 550° C. In the above process, the surface layer of the silicon oxide film 18 with a thickness of 0.5 nm is converted to a silicon nitric-oxide film 31. The silicon nitric-oxide film 31 has a higher dielectric constant compared to the silicon oxide film 18; thus, a lower silicon oxide-equivalent thickness can be obtained, making the above process suitable for making a thinner gate insulator.

In this embodiment, the ions are removed by the ion filter 111 as shown in FIG. 8; therefore, when performing the plasma nitridation process on the silicon oxide film 18, which is directly adjacent to the channel region, the charged particles will not enter into the film and the threshold characteristics of the semiconductor device can be stabilized.

In FIG. 6D, a silicon nitride film 19 is formed on the silicon nitric-oxide film 31, as in the first embodiment. For example, in this embodiment, the substrate is heated to a temperature of 650° C., and the mixed gas is flowed for 1 minute to form a silicon nitride film 19 with a thickness of 1.0 nm.

In FIG. 7E, a plasma nitridation process is performed on the silicon nitride film 19, as in the first embodiment. For example, in this embodiment, the plasma is generated with an output of 3 kW, and only the nitrogen radicals are flowed for 60 seconds at a substrate temperature of 550° C. In the above plasma nitridation process, the nitrogen radicals are bonded to the dangling bonds of the silicon nitride film 19 so as to form a high-quality silicon nitride film 19.

Next, an annealing process is performed on the substrate in a non-oxide gas atmosphere, as in the first embodiment. For example, in this embodiment, the annealing process is performed for 10 seconds in a $N_2$ gas atmosphere at a temperature of 1050° C.

In FIG. 7F, a poly-silicon film 20 is formed on the silicon nitride film 19, as in the first embodiment. For example, in this embodiment, the substrate is heated to 620° C., and mono-silane gas is flowed for 20 minutes to form a poly-silicon film 20 with a thickness of 110 nm.

In this way, a gate insulator having the silicon oxide film 18, the silicon nitric-oxide film 31, and the silicon nitride film 19 layered one on top of the other in this order is formed resulting in the CMOS device as shown in FIG. 7G.

As described above, by converting a portion of the silicon oxide film 18 into the silicon nitric-oxide film 31 through silicon nitridation, the silicon oxide-equivalent thickness can be reduced due to the fact that the silicon nitric-oxide film 31 has a higher dielectric constant compared to the silicon oxide film 18. Also, through the plasma nitridation process, the dangling bonds of the silicon nitride film 19 are terminated by the nitrogen radicals, and the film quality can be improved. In turn, the gate leakage current can be reduced and the gate insulator can be made even thinner.

A third embodiment of the present invention involves performing the processes of the first embodiment as well as performing a thermal process in an oxide gas atmosphere on the silicon nitride film 19 in between the plasma nitridation process and the thermal process in a non-oxide gas atmosphere. The description of the processes of this embodiment that are identical to those of the first embodiment are omitted.

In this embodiment, the substrate is thermally processed in an oxide gas atmosphere after the plasma nitridation process of the silicon nitride film 19 according to the first embodiment. The oxide gas can be, for example, NO, $N_2O$, $O_2$, etc. Specifically, the substrate is heated to a temperature within a range of 700–1100° C., and thermally processed for a duration of 3–60 seconds. The thermal processing device can be, for example, an RTP device, etc.

After the above-described process is performed, the processes of the first embodiment are resumed so as to form the gate insulator with the silicon oxide film 18 and the silicon nitride film 19 layered on top of the other in this order, resulting in the formation of a CMOS device.

In this third embodiment, dangling bonds of Si atoms and N atoms still exist on the uppermost surface of the silicon nitride film that has undergone the plasma nitridation processing. These dangling bonds cause the flat band shift of the MOS transistor and the widening of the threshold voltage of the MOS transistor. By performing a thermal process on the silicon nitride film 19 in an oxide gas atmosphere, the above dangling bonds can be terminated by the oxygen atoms, thereby further stabilizing the silicon nitride film 19. In this way, the flat band shift of the MOS transistor can be compensated for and the leakage current can be further reduced.

Figure 9:
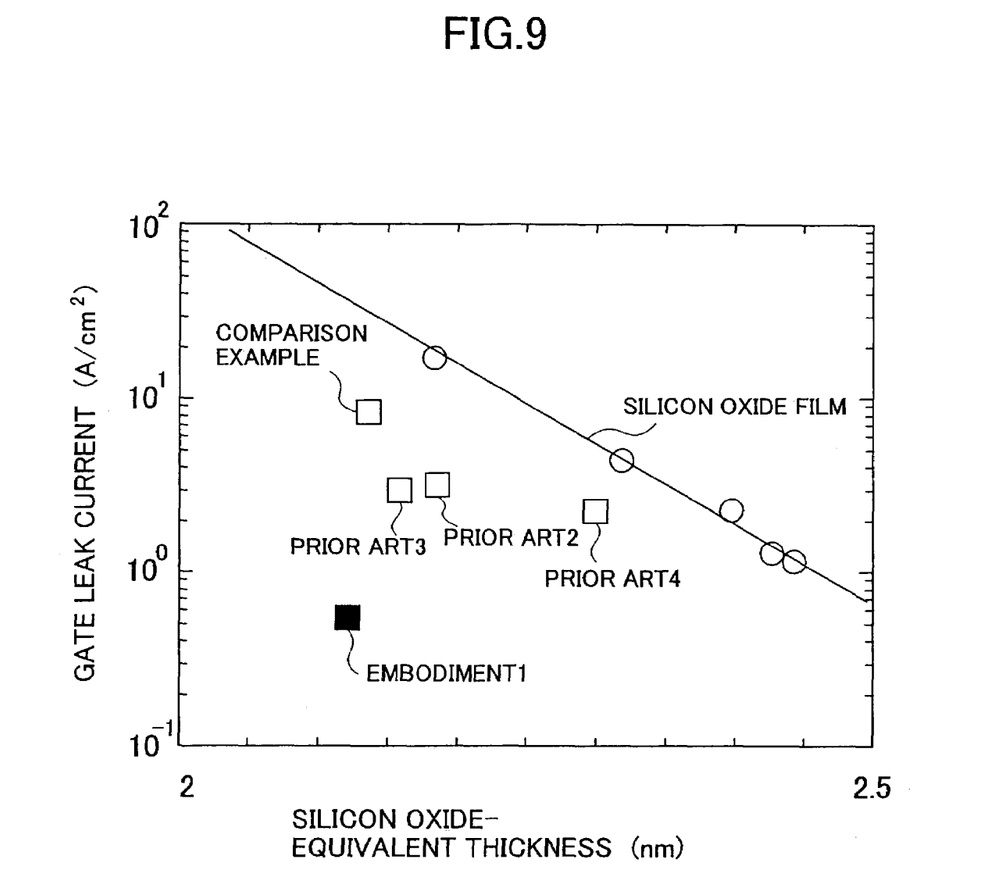

FIG. 9 shows the relationship between the gate leakage current and the silicon oxide-equivalent thickness of the gate insulator. Specifically, FIG. 9 shows the above relationship for the first embodiment (embodiment 1) of the present invention, a comparison example (comparison example 1) that does not correspond to the present invention, the examples of the prior art (prior art 2–4) described in the "Description of the Related Art", and an example of a gate insulator composed of only the silicon oxide film. The first comparison example represents a gate insulator that is not formed using the plasma nitridation process and the annealing process in a non-oxide gas atmosphere as in the first embodiment.

According to FIG. 9, the relationship between the gate leakage current and the silicon oxide-equivalent thickness is such that the gate leakage current decreases as the silicon oxide-equivalent thickness increases as indicated by the data of the gate insulator composed of only the silicon oxide film. In comparison example 1, in which the plasma nitridation process and the annealing process in a non-oxide gas atmosphere is not performed, the gate leakage current is at 9 $A/cm^2$, whereas in embodiment 1, which has practically the same silicon oxide-equivalent thickness as that of comparison example 1, the gate leakage current is significantly lower at 0.6 $A/cm^2$.

The gate leakage current in embodiment 1 is also significantly lower compared to prior art 2–4 or the gate insulator composed of only the silicon oxide film, considering the differences in the silicon oxide-equivalent thickness. In other words, the gate insulator of embodiment 1 has a significantly reduced gate leakage current, and could therefore be regarded as an ideal gate insulator. Further, the gate insulator of embodiment 1 can be made thinner, thus enabling the further miniaturization of the CMOS device in accordance with the scaling law.

In the above, a detailed description of the preferred embodiments of the present invention has been given; however, the present invention is not limited to these specific embodiments. Rather, various modifications and changes can be made within the scope of the present invention defined by the claims. For example, in the above description of the preferred embodiments, the present invention is applied to the fabrication of a gate insulator; however, the above fabrication method can also be applied to the fabrication of a capacitor such as is used in DRAM (dynamic random access memory).

Also, the processes of the second embodiment and the third embodiment may be combined. Furthermore, although the plasma nitridation processing of the silicon nitride film 19 is performed by the nitrogen ions as well as the nitrogen radicals in the description of the above first through third embodiments, the process can also be performed using only the nitrogen radicals.

According to the present invention, an insulating film containing silicon and oxygen is formed on the substrate so that the segregation of the nitrogen atoms at the interface of the substrate and the insulator can be prevented; further, a silicon nitride film, which has a high relative dielectric constant, is formed on the above insulator so that the silicon oxide-equivalent thickness of the entire film including the silicon nitride film and the insulating film can be greatly reduced. Particularly, by making the film thickness of the above insulating film containing silicon and oxygen smaller than the film thickness of the silicon nitride film, an even smaller silicon oxide-equivalent thickness can be realized.

This patent application is based on and claims the benefit of the earlier filing date of Japanese patent application No. 2002-177506 filed on Jun. 18, 2002, the entire contents of which are hereby incorporated by reference.

What is claimed is:

1. A method of fabricating a semiconductor device comprising the steps of:
   forming an insulating film containing silicon and oxygen and having a film thickness that is less than or equal to 1.5 nm on a silicon substrate;
   forming a silicon nitride film having a film thickness that is less than or equal to 1.5 nm on top of said insulating film;
   modifying the properties of said silicon nitride film by performing a plasma nitridation process; and,
   wherein said silicon nitride film does not exceed the less than 1.5 nm thickness after plasma nitridation.

2. A method of fabricating a semiconductor device comprising the steps of:
   forming an insulating film containing silicon and oxygen and having a film thickness that is less than or equal to 1.5 nm over a gate region that is on a silicon substrate;
   forming a silicon nitride film having a film thickness that is less than 1.5 nm on top of said insulating film;
   modifying the properties of said silicon nitride film by performing a plasma nitridation process;
   forming a gate electrode; and,
   wherein said silicon nitride film does not exceed the less than 1.5 nm thickness after plasma nitridation.

3. The method of fabricating a semiconductor device as claimed in claim 1, wherein:
   said insulating film is a silicon oxide film.

4. The method of fabricating a semiconductor device as claimed in claim 1, wherein:
   said insulating film is a silicon thermal oxide film.

5. The method of fabricating a semiconductor device as claimed in claim 1, wherein:
   said plasma nitridation process is performed using a microwave remote plasma processing apparatus.

6. The method of fabricating a semiconductor device as claimed in claim 2, wherein:
   said plasma nitridation process is performed using a microwave remote plasma processing apparatus.

7. The method of fabricating a semiconductor device as claimed in claim 1, wherein:
   said plasma nitridation process includes supplying a nitrogen radical to the surface of said silicon nitride film.

8. The method of fabricating a semiconductor device as claimed in claim 2, wherein:
   said plasma nitridation process includes supplying a nitrogen radical to the surface of said silicon nitride film.

9. The method of fabricating a semiconductor device as claimed in claim 1, wherein:
   said plasma nitridation process includes supplying a nitrogen radical and a nitrogen ion to the surface of said silicon nitride film.

10. The method of fabricating a semiconductor device as claimed in claim 2, wherein:
    said plasma nitridation process includes supplying a nitrogen radical and a nitrogen ion to the surface of said silicon nitride film.

11. The method of fabricating a semiconductor device as claimed in claim 1, further comprising:
    a step of performing a thermal process in a non-oxidative gas atmosphere after said plasma nitridation process.

12. The method of fabricating a semiconductor device as claimed in claim 2, further comprising:
    a step of performing a thermal process in a non-oxidative gas atmosphere after said plasma nitridation process.

13. The method of fabricating a semiconductor device as claimed in claim 11, further comprising:
    a step of performing a thermal process in an oxidative gas atmosphere, which step is performed in between said plasma nitridation process and said thermal process in a non-oxidative gas atmosphere.

14. The method of fabricating a semiconductor device as claimed in claim 12, further comprising:
    a step of performing a thermal process in an oxidative gas atmosphere, which step is performed in between said plasma nitridation process and said thermal process in a non-oxidative gas atmosphere.

15. The method of fabricating a semiconductor device as claimed in claim 1, further comprising:
    a step of performing the plasma nitridation process on said insulating film; and,
    a step of converting said insulating film to a silicon oxynitride film.

16. The method of fabricating a semiconductor device as claimed in claim 2, further comprising:
    a step of performing the plasma nitridation process on said insulating film; and,
    a step of converting said insulating film to a silicon oxynitride film.

17. The method of fabricating a semiconductor device as claimed in claim 15, wherein:
    said plasma nitridation process of the insulating film is performed using a microwave remote plasma processing apparatus, and further comprises a step of supplying a nitrogen radical generated in said process to the surface of said substrate via an ion filter.

18. The method of fabricating a semiconductor device as claimed in claim 11, wherein:
    said thermal process in a non-oxidative gas atmosphere is performed at a substrate temperature within a range of 600° C.–1100° C.

19. The method of fabricating a semiconductor device as claimed in claim 1, wherein:
    said silicon nitride film is formed using a chemical vapor deposition technique.

20. The method of fabricating a semiconductor device as claimed in claim 1, wherein:
    said plasma nitridation process is performed at a substrate temperature within a range of 20° C.–600° C.

21. The method of fabricating a semiconductor device as claimed in claim 1, further comprising:
    a step of forming a poly-silicon film directly overlaying the less than 1.5 nm thick silicon nitride film.

22. The method of fabricating a semiconductor device as claimed in claim 2, further comprising:
    a step of forming a poly-silicon film directly overlaying the less than 1.5 nm thick silicon nitride film.

* * * * *